United States Patent
Chen et al.

(10) Patent No.: US 11,222,968 B2
(45) Date of Patent: Jan. 11, 2022

(54) HEMT DEVICE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Po-Chih Chen, Hsinchu (TW); Jiun-Lei Yu, Hsinchu County (TW); Yao-Chung Chang, Hsinchu County (TW); Chun-Lin Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/730,428

(22) Filed: Dec. 30, 2019

(65) Prior Publication Data
US 2020/0144408 A1    May 7, 2020

Related U.S. Application Data (60) Continuation of application No. 16/113,443, filed on Aug. 27, 2018, now Pat. No. 10,522,671, which is a
(Continued)

(51) Int. Cl.
*H01L 29/778* (2006.01)
*H01L 29/205* (2006.01)
(Continued)

(52) U.S. Cl.
CPC .... *H01L 29/7787* (2013.01); *H01L 21/02617* (2013.01); *H01L 29/1054* (2013.01);
(Continued)

(58) Field of Classification Search
CPC ........... H01L 29/7787; H01L 29/66462; H01L 29/2003; H01L 21/02617; H01L 29/1054
See application file for complete search history.

(56) References Cited

U.S. PATENT DOCUMENTS 6,521,961 B1    2/2003  Costa et al.
2009/0267078 A1*  10/2009  Mishra ............... H01L 29/0847
                                                  257/76
(Continued)

FOREIGN PATENT DOCUMENTS

TW          525234 B      3/2003
TW       201419546 A      5/2014

OTHER PUBLICATIONS

Office Action and Search Report dated Jun. 22, 2020 issued by Taiwan Intellectual Property Office for counterpart application No. 106103620.
(Continued)

*Primary Examiner* — Wasiul Haider
(74) *Attorney, Agent, or Firm* — WPAT, P.C., Intellectual Property Attorneys; Anthony King (57) ABSTRACT

The present disclosure provides a semiconductor device comprising a substrate; a first III-V compound layer over the substrate; a second III-V compound layer on the first III-V compound layer; a third III-V compound layer on the second III-V compound layer; a source region on the third III-V compound layer; a drain region on the third III-V compound layer; a first dielectric layer arranged on the second III-V compound layer through the third III-V compound layer; and a gate region on the first dielectric layer, wherein a bottom of the gate region is higher than a top surface of the first dielectric layer; the second lateral distance is larger than the first lateral distance.

20 Claims, 7 Drawing Sheets

Related U.S. Application Data division of application No. 15/017,234, filed on Feb. 5, 2016, now Pat. No. 10,062,776.

(51) Int. Cl.
   *H01L 21/02* (2006.01)
   *H01L 29/10* (2006.01)
   *H01L 29/66* (2006.01)
   H01L 29/423 (2006.01)
   H01L 29/20 (2006.01)

(52) U.S. Cl.
   CPC ...... *H01L 29/205* (2013.01); *H01L 29/66462* (2013.01); *H01L 29/2003* (2013.01); *H01L 29/4236* (2013.01)

(56) References Cited

U.S. PATENT DOCUMENTS

| | | | |
|---|---|---|---|
| 2012/0196419 A1* | 8/2012 | Kanamura | H01L 29/42316 438/287 |
| 2012/0280244 A1* | 11/2012 | Hwang | H01L 29/205 257/76 |
| 2013/0292698 A1* | 11/2013 | Then | H01L 29/7787 257/76 |
| 2014/0131720 A1 | 5/2014 | Hsiung et al. | |
| 2016/0172474 A1* | 6/2016 | Miyake | H01L 29/4236 257/76 |
| 2016/0276473 A1* | 9/2016 | Edwards | H01L 29/7786 |
| 2016/0293709 A1* | 10/2016 | Nakayama | H01L 29/1087 |

OTHER PUBLICATIONS

Office Action and Cited References dated Feb. 18, 2021 issued by the China National Intellectual Property Administration for the Chinese counterpart application 201710051154.7.
U.S. Pat. No. 6521961B1 corresponds to TW525234B.
US20140131720A1 corresponds to TW201419546A.

\* cited by examiner

HEMT DEVICE STRUCTURE AND MANUFACTURING METHOD THEREOF

CROSS REFERENCE TO RELATED APPLICATIONS

This application is a continuation application of a regular application Ser. No. 15/017,234, filed on Feb. 5, 2016 and a divisional application Ser. No. 16/113,443 filed on Aug. 27, 2018. All of the above-referenced applications are hereby incorporated herein by reference in their entirety.

FIELD

The present disclosure relates generally to a semiconductor structure and a method of manufacturing a semiconductor structure.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
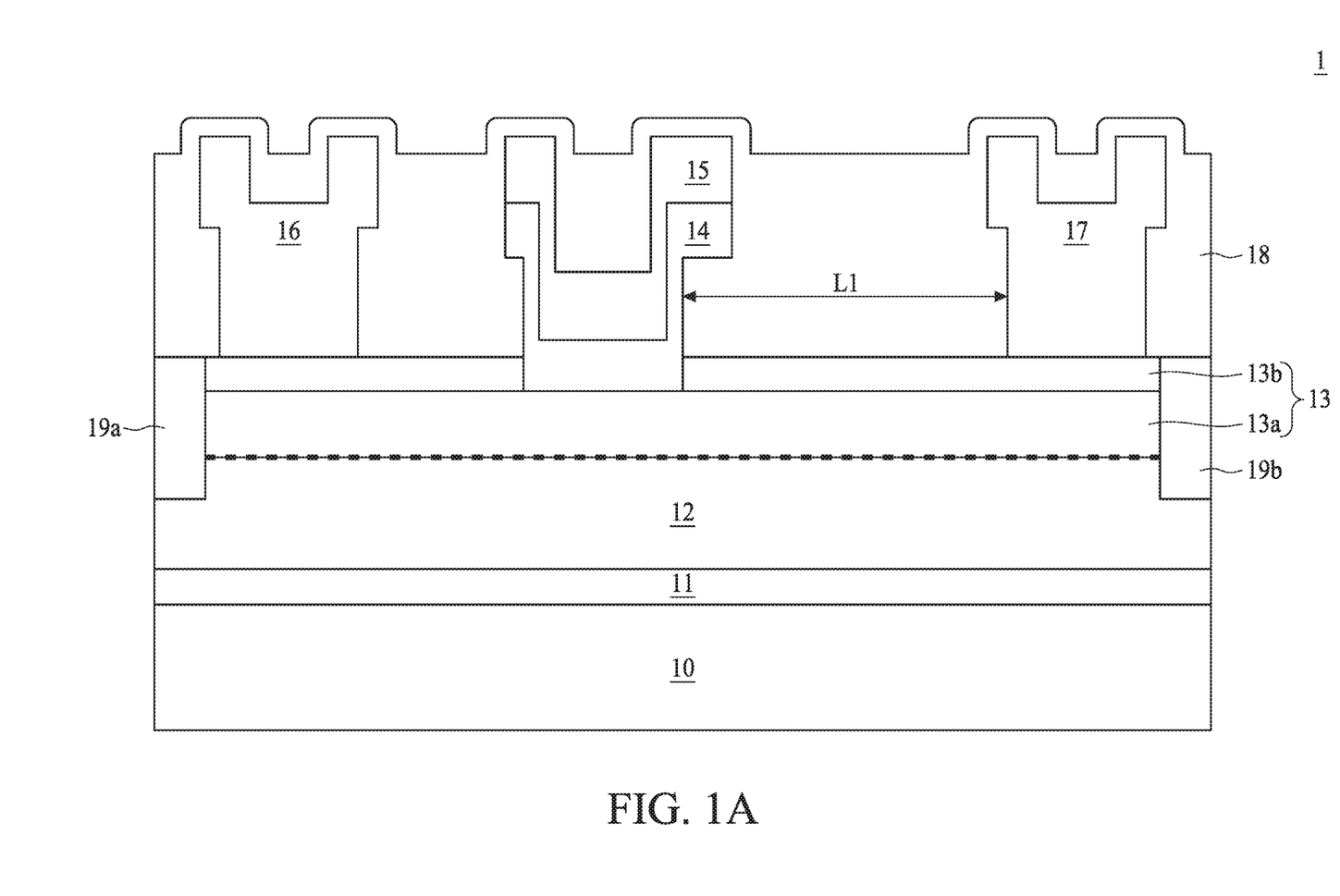
FIG. 1A is a cross-sectional view of a semiconductor structure in accordance with some embodiments of the present disclosure.

FIG. 1A is a cross-sectional view of a semiconductor structure 1 according to one or more embodiments of the present disclosure. In some embodiments, the semiconductor structure 1 may be a high electron mobility transistor (HEMT). The semiconductor structure 1 includes a substrate 10, a buffer layer 11, a first III-V compound layer 12, a second III-V compound layer 13, a first dielectric layer 14, a second dielectric layer 18, a gate region 15, a source region 16, a drain region 17 and isolation regions 19a, 19b.

In some embodiments, the substrate 10 includes a silicon carbide (SiC) substrate, sapphire substrate or a silicon substrate. The semiconductor structure 1 also includes a heterojunction formed between two different semiconductor material layers, such as material layers with different band gaps. For example, the semiconductor structure 1 includes a non-doped narrow-band gap channel layer and a wide-band gap n-type donor-supply layer.

The buffer layer 11 is on the substrate 10. The buffer layer 11 acts as a buffer and/or a transition layer for the subsequently formed overlying layers. The buffer layer 11 may be epitaxially grown using Metal Organic Vapor Phase Epitaxy (MOVPE). The buffer layer 11 may function as an interface to reduce lattice mismatch between substrate 10 and the first III-V compound layer 12. In some embodiments, the buffer layer 11 includes an aluminum nitride (AlN) layer having a thickness in a range between about 10 nanometers (nm) and about 300 nm. The buffer layer 11 may include a single layer or a plurality of layers. In the case of multiple layers, the buffer layer 11 may include a low-temperature AlN layer (not shown in the drawing) formed at a temperature between about 800 Celsius degrees (° C.) and about 1,200° C., and a high-temperature AlN layer (not shown in the drawing) formed at a temperature between about 1,000° C. and about 1,400° C.

The first III-V compound layer 12 is on the buffer layer 11. The first III-V compound layer 12 is a compound made from the III-V groups in the periodic table of elements. In some embodiments of the present disclosure, the first III-V compound layer 12 includes a gallium nitride (GaN) layer. In some embodiments, the first III-V compound layer 12 includes a GaAs layer or InP layer. In some embodiments, the first III-V compound layer 12 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals.

The first III-V compound layer 12 is undoped. Alternatively, the first III-V compound layer 12 is unintentionally doped and may be, for example, lightly doped with n-type dopants due to a precursor used to form the first III-V compound layer 12. In some embodiments, the first III-V compound layer 12 has a thickness in a range from about 0.5 microns (μm) to about 10 μm.

The second III-V compound layer 13 is on the first III-V compound layer 12. The second III-V compound layer 13 is a compound made from the III-V groups in the periodic table of elements. The second III-V compound layer 13 and the first III-V compound layer 12 are different from each other in composition. In some embodiments of the present disclosure, the second III-V compound layer 13 includes an aluminum gallium nitride (AlGaN) layer. In some embodiments, the second III-V compound layer 13 includes an AlGaAs layer or an AlInP layer. The second III-V compound layer 13 is intentionally doped. In some embodiments, the second III-V compound layer 13 has a thickness in a range from about 5 nm to about 50 nm.

As shown in FIG. 1A, the second III-V compound layer 13 has two III-V compound layers 13a and 13b. In some embodiments, both of the III-V compound layers 13a and 13b are AlGaN with different percentages of Al. Alternatively, both of the III-V compound layers 13a and 13b may be AlGaAs or AlInP with different percentages of Al. The percentage of Al of the III-V compound layer 13a is lower than that of the III-V compound layer 13b. In some embodiments, a ratio of the percentage of Al of AlGaN of the III-V compound layer 13b to that of the III-V compound layer 13a is in a range from about 1.1 to 2.5. For example, the percentage of Al of AlGaN of the III-V compound layer 13a is 16% and the percentage of Al of AlGaN of the III-V compound layer 13b would be in a range from about 17.6% to 40%. In some embodiments, the percentage of Al of AlGaN of the III-V compound layer 13a is in a range from about 12% to about 18% while the percentage of Al of AlGaN of the III-V compound layer 13b is in a range from about 23% to about 40%.

In some embodiments, the second III-V compound layer 13 may have more than two AlGaN layers, each having a different percentage of Al. In some embodiments, the percentage of Al of AlGaN layers increases as the AlGaN layer is distant from the first III-V compound layer 12. Therefore, an AlGaN layer with a higher percentage of Al would be grown on an AlGaN layer with a lower percentage of Al.

The isolation regions 19a, 19b are at both sides within the first III-V compound layer 12 and the second III-V compound layer 13. The isolation regions 19a, 19b isolate the HEMT in the semiconductor structure 1 from other devices in the substrate 10. In some embodiments, the isolation regions 19a, 19b include doped regions with species of oxygen or nitrogen.

The source region 16 is on the III-V compound layer 13b. In some embodiments, the source region 16 includes aluminum (Al), titanium (Ti), nickel (Ni), gold (Au) or copper (Cu). The drain region 17 is on the III-V compound layer 13b and spaced apart from the source region 16. In some embodiments, the drain region 17 includes Al, Ti, Ni, Au or Cu.

The first dielectric layer 14 penetrates the III-V compound layer 13b and is located on the III-V compound layer 13a. The first dielectric layer 14 is configured to protect the underlying second III-V compound layer 13 from damage in the process having plasma. In some embodiments, the first dielectric layer 14 has a thickness in a range between about 100 angstroms (Å) and about 5,000 Å. In some embodiments, the first dielectric layer 14 may be a passivation layer including silicon oxide and/or silicon nitride. When comprising silicon nitride, the first dielectric layer 14 may be formed by performing a Low-Pressure Chemical Vapor Deposition (LPCVD) method (without plasma) using $SiH_4$ and $NH_3$ gases.

The gate region 15 is on the first dielectric layer 14 and between the source region 16 and the drain region 17. The gate region 15 includes a conductive material layer configured for voltage bias. In some embodiments, the conductive material layer includes a refractory metal or its compounds, e.g., titanium (Ti), titanium nitride (TiN), titanium tungsten (TiW) and tungsten (W). Alternatively, the conductive material layer includes nickel (Ni), gold (Au) or copper (Cu).

The second dielectric layer 18 is on the III-V compound layer 13b and the isolation layers 19a, 19b. The second dielectric layer 18 surrounds the source region 16, the drain region 17, the first dielectric layer 14 and the gate region 15. The second dielectric layer 18 is configured to protect the underlying III-V compound layer 13b from damage in the process having plasma. In some examples, the second dielectric layer 18 may be a passivation layer including silicon oxide, silicon nitride, gallium oxide, aluminum oxide, scandium oxide, zirconium oxide, lanthanum oxide or hafnium oxide.

In some embodiments, the semiconductor structure 1 may further include a protection layer (not shown in the drawing). The protection layer is disposed between the source region 16 and the second dielectric layer 18 and between the drain region 17 and the second dielectric layer 18. The protection layer covers the source region 16 and the drain region 17 to prevent the source region 16 and the drain region 17 from exposure during an annealing process in the formation of the isolation regions 19a, 19b.

In some existing approaches, a III-V compound semiconductor structure only has a single AlGaN layer. Therefore, the percentage of Al of AlGaN layer is a critical parameter to determine the performance the semiconductor structure. In the case of low percentage of Al, electrons would be trapped easily during the operation of the semiconductor structure due to the low energy barrier, which would increase on-resistance (Ron) of the semiconductor structure and decay the efficiency of the semiconductor structure. Although increasing the percentage of Al of the AlGaN layer may solve the above issue, the higher percentage of Al of the AlGaN layer would result in a high lattice mismatch between the AlGaN layer and the underlying GaN layer, which would reduce the reliability of the semiconductor structure. Therefore, it is difficult to obtain a III-V compound semiconductor structure with low on-resistance and high reliability by using a single AlGaN layer.

In accordance with some embodiments of the present disclosure, the semiconductor structure has multiple AlGaN layers, each having a different percentage of Al. By growing a AlGaN layer 13a with a lower percentage of Al directly on the GaN layer, the lattice mismatch between the AlGaN layer and the GaN layer would be reduced. Growing another AlGaN layer 13b with a higher percentage of Al on the AlGaN layer 13a would increase the energy barrier to avoid the electrons from being trapped easily, which would reduce the on-resistance of the semiconductor structure 1. Therefore, in comparison with the existing semiconductor structure with a single AlGaN layer, the semiconductor structure 1 has lower on-resistance and higher efficiency without reducing the reliability.

Figure 1B:
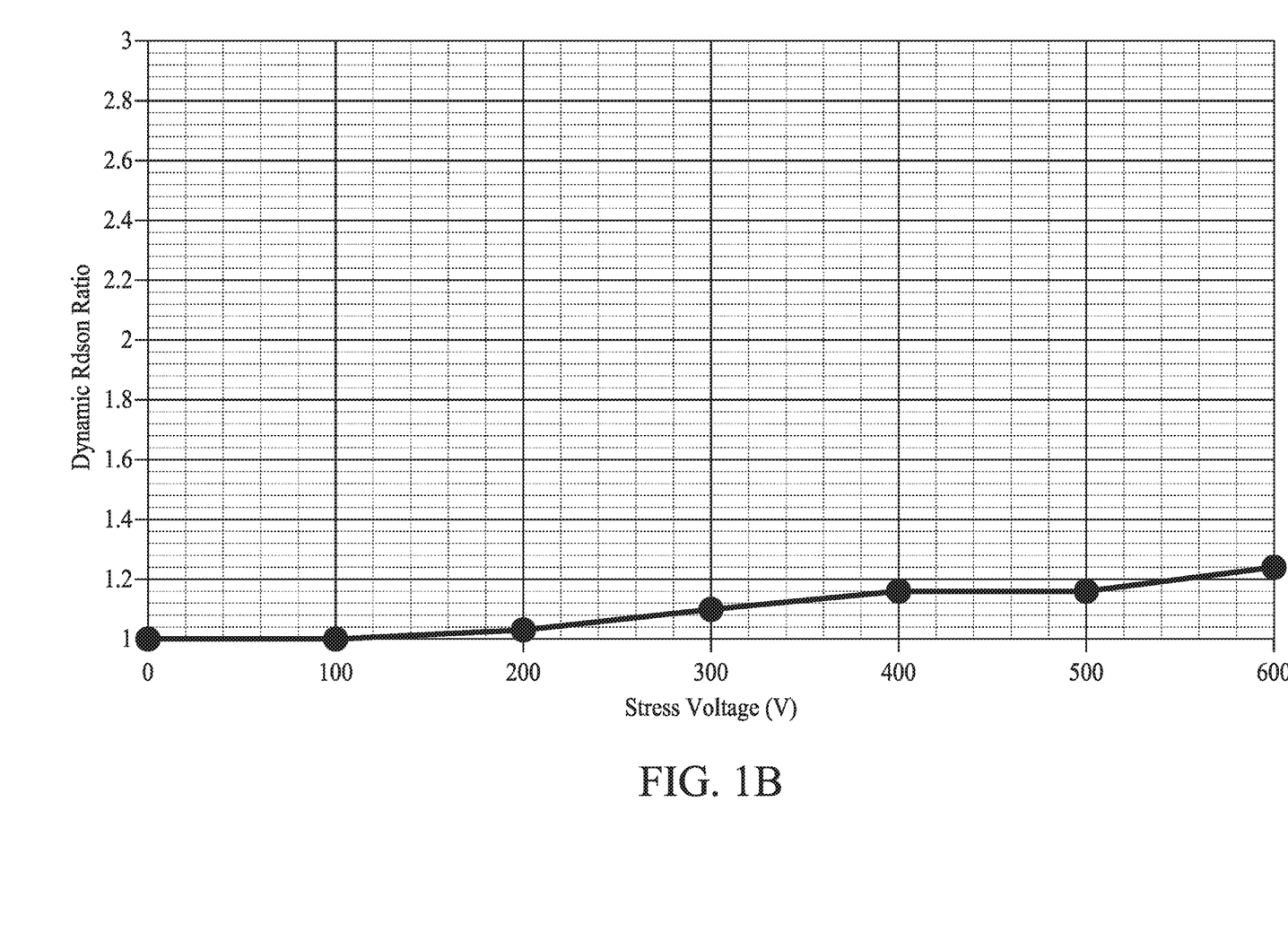
FIG. 1B is a graph showing a measurement result of the semiconductor structure of FIG. 1A in accordance with some embodiments of the present disclosure.

FIG. 1B illustrates a measurement result of the semiconductor structure 1 in FIG. 1A, in accordance with some embodiments. In FIG. 1B, the x-axis represents a reverse bias stress voltage applied to the semiconductor structure 1, and the y-axis represents a dynamic on-resistance ratio that is a ratio between the on-resistance of the semiconductor structure to which a reverse bias stress voltage is applied and the on-resistance of the semiconductor structure to which a reverse bias stress voltage is not applied.

As shown in FIG. 1B, under 300V stress voltage, the dynamic on-resistance ratio of the semiconductor structure 1 is about 1.1, which is about 25% lower than that of the existing semiconductor structure with a single AlGaN layer. Under 400V stress voltage, the dynamic on-resistance ratio of the semiconductor structure 1 is about 1.8, which is about 62% lower than that of the existing semiconductor structure with a single AlGaN layer. Lower dynamic on-resistance ratio would increase the efficiency and the performance of the semiconductor structure 1.

Figure 2:
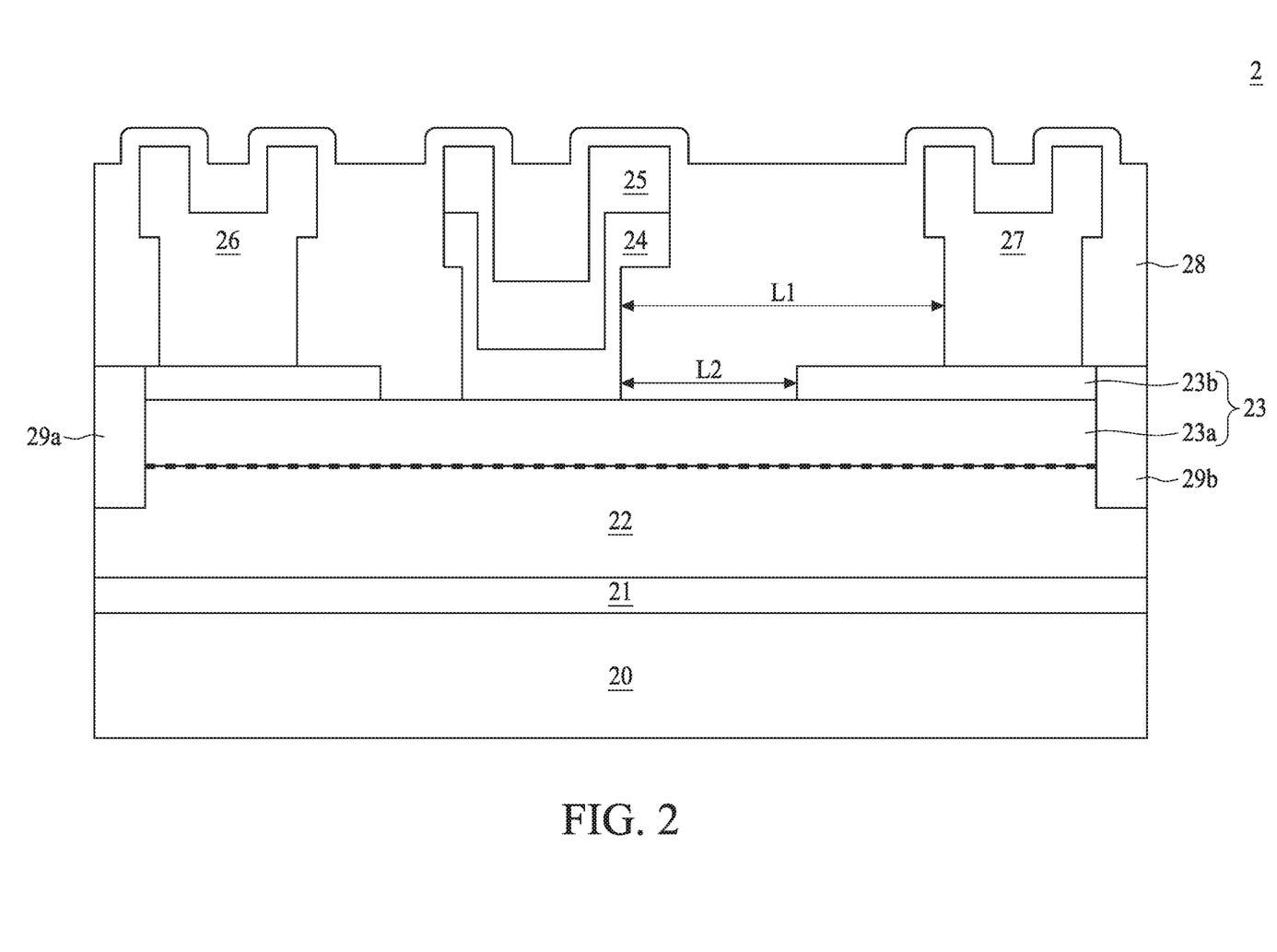
FIG. 2 is a cross-sectional view of a semiconductor structure in accordance with some embodiments of the present disclosure.

FIG. 2 is a cross-sectional view of a semiconductor structure 2 according to one or more embodiments of the present disclosure. In some embodiments, the semiconductor structure 2 may be a high electron mobility transistor (HEMT). The semiconductor structure 2 includes a substrate 20, a buffer layer 21, a first III-V compound layer 22, a second III-V compound layer 23, a first dielectric layer 24, a second dielectric layer 28, a gate region 25, a source region 26, a drain region 27 and isolation regions 29a, 29b.

In some embodiments, the substrate 20 includes a silicon carbide (SiC) substrate, sapphire substrate or a silicon substrate. The semiconductor structure 2 also includes a heterojunction formed between two different semiconductor material layers, such as material layers with different band gaps. For example, the semiconductor structure 2 includes a non-doped narrow-band gap channel layer and a wide-band gap n-type donor-supply layer.

The buffer layer 21 is on the substrate 20. The buffer layer 21 acts as a buffer and/or a transition layer for the subsequently formed overlying layers. The buffer layer 21 may be epitaxially grown using Metal Organic Vapor Phase Epitaxy (MOVPE). The buffer layer 21 may function as an interface to reduce lattice mismatch between substrate 20 and the first III-V compound layer 22. In some embodiments, the buffer layer 21 includes an aluminum nitride (AlN) layer having a thickness in a range between about 10 nanometers (nm) and about 300 nm. The buffer layer 21 may include a single layer or a plurality of layers. For example, the buffer layer 21 may include a low-temperature AlN layer (not shown in the drawing) formed at a temperature between about 800° C. and about 1,200° C., and a high-temperature AlN layer (not shown in the drawing) formed at a temperature between about 1,000° C. and about 1,400° C.

The first III-V compound layer 22 is on the buffer layer 21. The first III-V compound layer 22 is a compound made from the III-V groups in the periodic table of elements. In some embodiments of the present disclosure, the first III-V compound layer 22 includes a gallium nitride (GaN) layer.

In some embodiments, the first III-V compound layer 22 includes a GaAs layer or InP layer. In some embodiments, the first III-V compound layer 22 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals.

The first III-V compound layer 22 is undoped. Alternatively, the first III-V compound layer 22 is unintentionally doped and may be, for example, lightly doped with n-type dopants due to a precursor used to form the first III-V compound layer 22. In some embodiments, the first III-V compound layer 22 has a thickness in a range from about 0.5 microns (μm) to about 10 μm.

The second III-V compound layer 23 is on the first III-V compound layer 22 to cover a portion of the first III-V compound layer 22. The second III-V compound layer 23 is a compound made from the III-V groups in the periodic table of elements. The second III-V compound layer 23 and the first III-V compound layer 22 are different from each other in composition. In some embodiments of the present disclosure, the second III-V compound layer 23 includes an aluminum gallium nitride (AlGaN) layer. In some embodiments, the second III-V compound layer 23 includes an AlGaAs layer or an AlInP layer. The second III-V compound layer 23 is intentionally doped. In some embodiments, the second III-V compound layer 23 has a thickness in a range from about 5 nm to about 50 nm.

As shown in FIG. 2, the second III-V compound layer 23 has two III-V compound layers 23a and 23b. In some embodiments, both of the III-V compound layers 23a and 23b are AlGaN with different percentages of Al. Alternatively, both of the III-V compound layers 23a and 23b may be AlGaAs or AlInP with different percentages of Al. The percentage of Al of the III-V compound layer 23a is lower than that of the III-V compound layer 23b. In some embodiments, a ratio of the percentage of Al of AlGaN of the III-V compound layer 23b to that of the III-V compound layer 23a is in a range from about 1.1 to 2.5. For example, the percentage of Al of AlGaN of the III-V compound layer 23a is 16% and the percentage of Al of AlGaN of the III-V compound layer 23b would be in a range from about 17.6% to 40%. In some embodiments, the percentage of Al of AlGaN of the III-V compound layer 23a is in a range from about 12% to about 18% while the percentage of Al of AlGaN of the III-V compound layer 23b is in a range from about 23% to about 40%.

In some embodiments, the second III-V compound layer 23 may have more than two AlGaN layers, each having a different percentage of Al. In some embodiments, the percentage of Al of AlGaN layers increases as the AlGaN layer is distant from the first III-V compound layer 22. Therefore, an AlGaN layer with a higher percentage of Al would be grown on an AlGaN layer with a lower percentage of Al.

The isolation regions 29a, 29b are at both sides within the first III-V compound layer 22 and the second III-V compound layer 23. The isolation regions 29a, 29b isolate the HEMT in the semiconductor structure 2 from other devices in the substrate 20. In some embodiments, the isolation regions 29a, 29b include doped regions with species of oxygen or nitrogen.

The source region 26 is on the III-V compound layer 23b. In some embodiments, the source region 26 includes aluminum (Al), titanium (Ti), nickel (Ni), gold (Au) or copper (Cu). The drain region 27 is on the III-V compound layer 23b and spaced apart from the source region 26. In some embodiments, the drain region 27 includes Al, Ti, Ni, Au or Cu.

The first dielectric layer 24 is located on the III-V compound layer 23a and spaced apart from the III-V compound layer 23b. A ratio of a distance L2 between the first dielectric layer 24 and the III-V compound layer 23b beneath the drain region 27 to a distance L1 between the first dielectric layer 24 and the drain region 27 is in a range from 0 to about 0.8. In some embodiments, L1 is about 15 μm and L2 is less than 12 μm. The first dielectric layer 24 is configured to protect the underlying second III-V compound layer 23 from damage in the process having plasma. In some embodiments, the first dielectric layer 24 has a thickness in a range between about 100 Å and about 5,000 Å. In some embodiments, the first dielectric layer 24 may be a passivation layer including silicon oxide and/or silicon nitride. When comprising silicon nitride, the first dielectric layer 24 may be formed by performing a Low-Pressure Chemical Vapor Deposition (LPCVD) method (without plasma) using $SiH_4$ and $NH_3$ gases.

The gate region 25 is on the first dielectric layer 24 and between the source region 26 and the drain region 27. The gate region 25 includes a conductive material layer configured for voltage bias. In some embodiments, the conductive material layer includes a refractory metal or its compounds, e.g., titanium (Ti), titanium nitride (TiN), titanium tungsten (TiW) and tungsten (W). Alternatively, the conductive material layer includes nickel (Ni), gold (Au) or copper (Cu).

The second dielectric layer 28 is on the III-V compound layer 23b, the III-V compound layer 23a and the isolation layers 19a, 19b. The second dielectric layer 28 surrounds the source region 26, the drain region 27, the first dielectric layer 24 and the gate region 25. The second dielectric layer 28 is configured to protect the underlying III-V compound layer 23b from damage in the process having plasma. In some examples, the second dielectric layer 28 may be a passivation layer including silicon oxide, silicon nitride, gallium oxide, aluminum oxide, scandium oxide, zirconium oxide, lanthanum oxide or hafnium oxide.

In some embodiments, the semiconductor structure 2 may further include a protection layer (not shown in the drawing). The protection layer is disposed between the source region 26 and the second dielectric layer 28 and between the drain region 27 and the second dielectric layer 28. The protection layer covers the source region 26 and the drain region 27 to prevent the source region 26 and the drain region 27 from exposure during an annealing process in the formation of the isolation regions 29a, 29b.

In some existing approaches, a III-V compound semiconductor structure only has a single AlGaN layer. Therefore, the percentage of Al of AlGaN layer is a critical parameter to determine the performance the semiconductor structure. In the case of low percentage of Al, electrons would be trapped easily during the operation of the semiconductor structure due to the low energy barrier, which would increase on-resistance (Ron) of the semiconductor structure and decay the efficiency of the semiconductor structure. Although increasing the percentage of Al of the AlGaN layer may solve the above issue, the higher percentage of Al of the AlGaN layer would result in a high lattice mismatch between the AlGaN layer and the underlying GaN layer, which would reduce the reliability of the semiconductor structure. Therefore, it is difficult to obtain a III-V compound semiconductor structure with low on-resistance and high reliability by using a single AlGaN layer.

In accordance with some embodiments of the present disclosure, the semiconductor structure has multiple AlGaN layers, each having a different percentage of Al. By growing a AlGaN layer 23a with a lower percentage of Al directly on the GaN layer, the lattice mismatch between the AlGaN layer and the GaN layer would be reduced. Growing another AlGaN layer 23b with a higher percentage of Al on the AlGaN layer 23a would increase the energy barrier to avoid the electrons from being trapped easily, which would reduce the on-resistance of the semiconductor structure 2. Therefore, in comparison with the existing semiconductor structure with a single AlGaN layer, the semiconductor structure 2 has lower on-resistance and higher efficiency without reducing the reliability. In addition, in comparison with the semiconductor structure 1 shown in FIG. 1A, the semiconductor structure 2 may have better performance by separating the III-V compound layer 23b from the first dielectric layer 24.

FIG. 3A to FIG. 3D are cross-sectional views of a semiconductor structure 3 fabricated at various stages, in accordance with some embodiments of the present disclosure. Various figures have been simplified for a better understanding of the inventive concepts of the present disclosure.

Figure 3A:
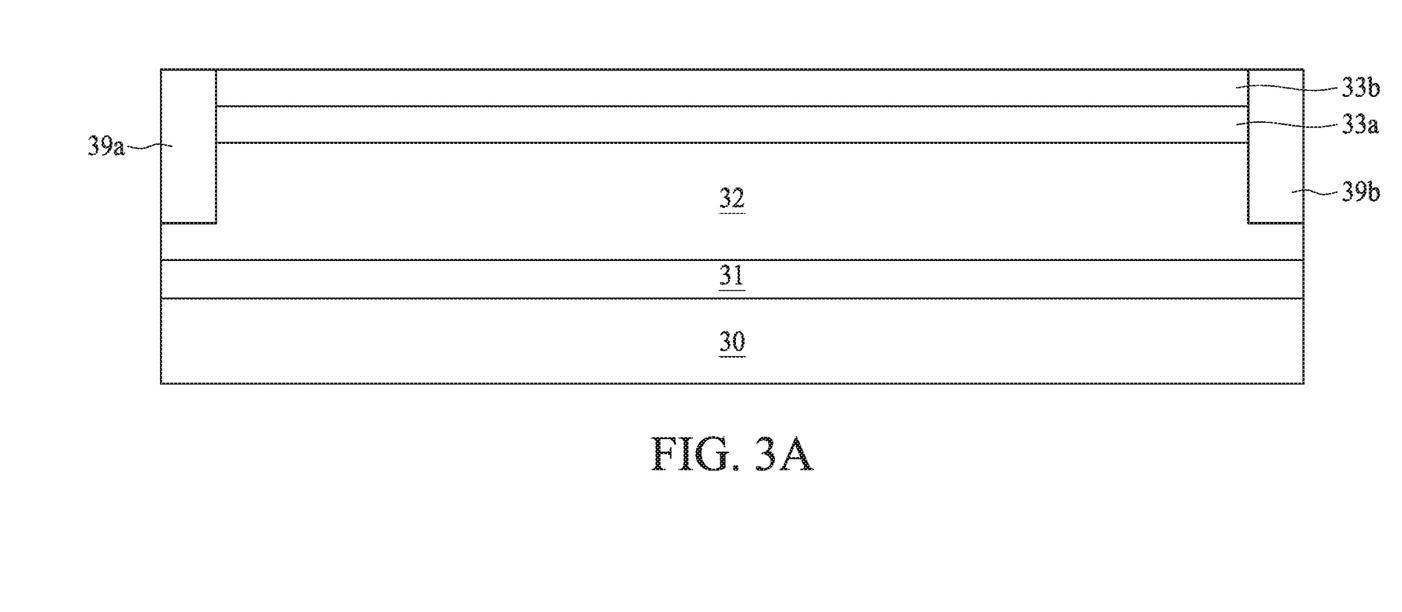
FIGS. 3A-3D are a series of cross-sectional views illustrating processing steps to fabricate the semiconductor structure, in accordance with some embodiments of the present disclosure.

Referring to FIG. 3A, a substrate 30 is provided. The substrate 30 includes a silicon carbide (SiC) substrate, sapphire substrate or a silicon substrate. The semiconductor structure 3 also includes a heterojunction formed between two different semiconductor material layers, such as material layers with different band gaps. For example, the semiconductor structure 3 includes a non-doped narrow-band gap channel layer and a wide-band gap n-type donor-supply layer.

The buffer layer 31 is formed on the substrate 30. The buffer layer 31 acts as a buffer and/or a transition layer for the subsequently formed overlying layers. The buffer layer 31 may be epitaxially grown using Metal Organic Vapor Phase Epitaxy (MOVPE). The buffer layer 31 may function as an interface to reduce lattice mismatch between substrate 30 and the subsequently formed III-V compound layer. In some embodiments, the buffer layer 31 includes an aluminum nitride (AlN) layer having a thickness in a range between about 10 nanometers (nm) and about 300 nm. The buffer layer 31 may include a single layer or a plurality of layers. For example, the buffer layer 31 may include a low-temperature AlN layer (not shown in the drawing) formed at a temperature between about 800° C. and about 1,200° C., and a high-temperature AlN layer (not shown in the drawing) formed at a temperature between about 1,000° C. and about 1,400° C.

The first III-V compound layer 32 is formed on the buffer layer 31. The first III-V compound layer 32 is a compound made from the III-V groups in the periodic table of elements. In some embodiments of the present disclosure, the first III-V compound layer 32 includes a gallium nitride (GaN) layer. In some embodiments, the first III-V compound layer 32 includes a GaAs layer or InP layer. In some embodiments, the first III-V compound layer 32 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiary-butylamine (TBAm), phenyl hydrazine, or other suitable chemicals.

The first III-V compound layer 32 is undoped. Alternatively, the first III-V compound layer 32 is unintentionally doped and may be, for example, lightly doped with n-type dopants due to a precursor used to form the first III-V compound layer 32. In some embodiments, the first III-V compound layer 32 has a thickness in a range from about 0.5 µm to about 10 µm.

The second III-V compound layer 33a is formed on the first III-V compound layer 32. The second III-V compound layer 33a is a compound made from the III-V groups in the periodic table of elements. The second III-V compound layer 33a and the first III-V compound layer 32 are different from each other in composition. In some embodiments of the present example, the second III-V compound layer 33a includes an aluminum gallium nitride (AlGaN) layer. In some embodiments, the second III-V compound layer 33a includes an AlGaAs layer or an AlInP layer. The second III-V compound layer 33a is intentionally doped. The second III-V compound layer 33a is epitaxially grown on the first III-V compound layer 32 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical.

The third III-V compound layer 33b is formed on the second III-V compound layer 33a. The third III-V compound layer 33b and the second III-V compound layer 33a are formed of same compound except that the percentage of Al of the third compound layer 33b is different from that of the second compound layer 33a. More specifically, the percentage of Al of the third compound layer 33b is higher than that of the second compound layer 33a. In some embodiments, a ratio of the percentage of Al of AlGaN of the third III-V compound layer 33b to that of the second III-V compound layer 33a is in a range from about 1.1 to 2.5. For example, the percentage of Al of AlGaN of the second III-V compound layer 33a is 16% and the percentage of Al of AlGaN of the third III-V compound layer 33b would be in a range from about 17.6% to 40%. In some embodiments, the percentage of Al of AlGaN of the III-V compound layer 33a is in a range from about 12% to about 18% while the percentage of Al of AlGaN of the III-V compound layer 33b is in a range from about 23% to about 40%.

The third III-V compound layer 33b is epitaxially grown on the second III-V compound layer 33a by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical.

The isolation regions 39a, 39b are formed at both sides within the first III-V compound layer 32, the second III-V compound layer 33a and the third III-V compound layer 33b. In some embodiments, the isolation regions 39a, 39b are formed by an implantation process with species of oxygen or nitrogen.

Figure 3B:
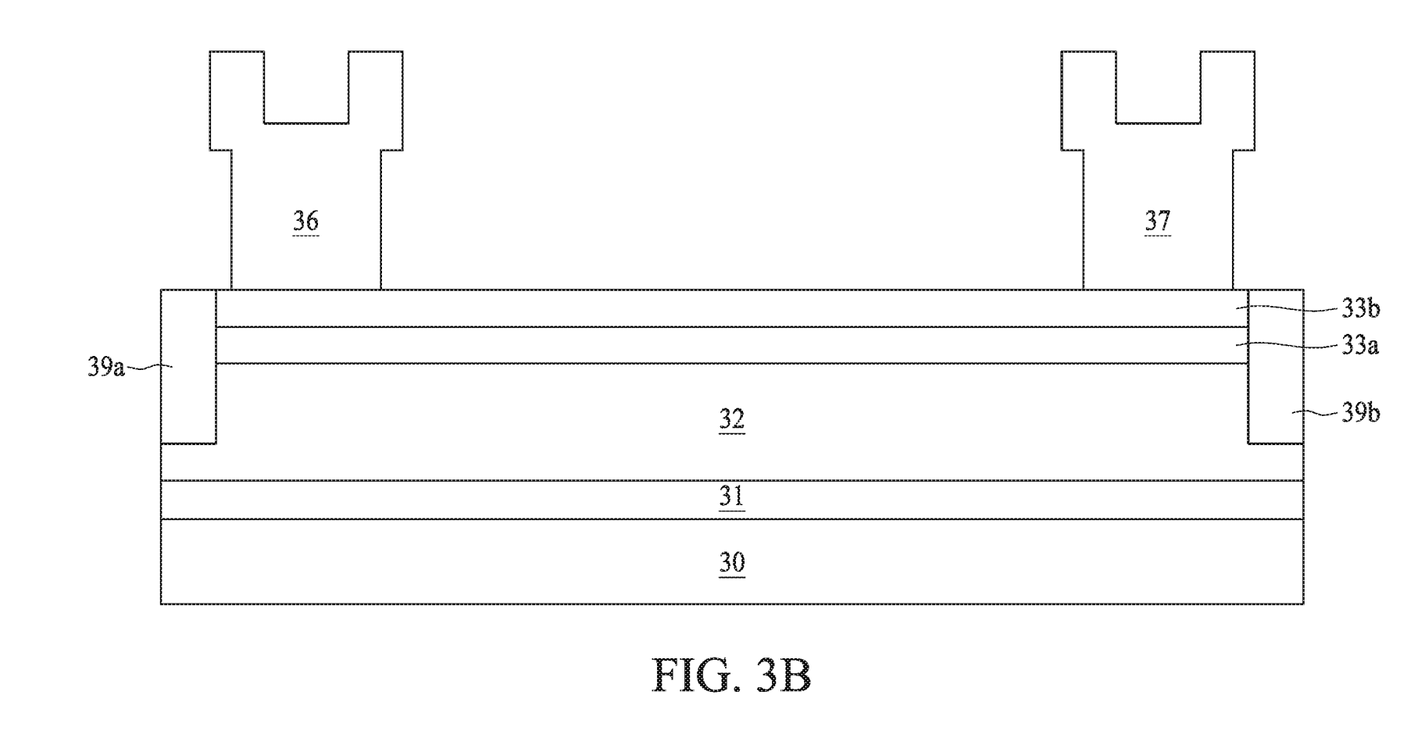

Referring to FIG. 3B, a source region 36 and a drain region 37 are formed on the third III-V compound layer 33b. In some embodiments, the source region 36 and the drain region 37 are formed by using sputtering, atomic layer deposition (ALD) or physical vapor deposition (PVD) operations. In some embodiments, the source region 36 and the drain region 37 include Au, Al, Ti, Ni, Au or Cu.

Figure 3C:
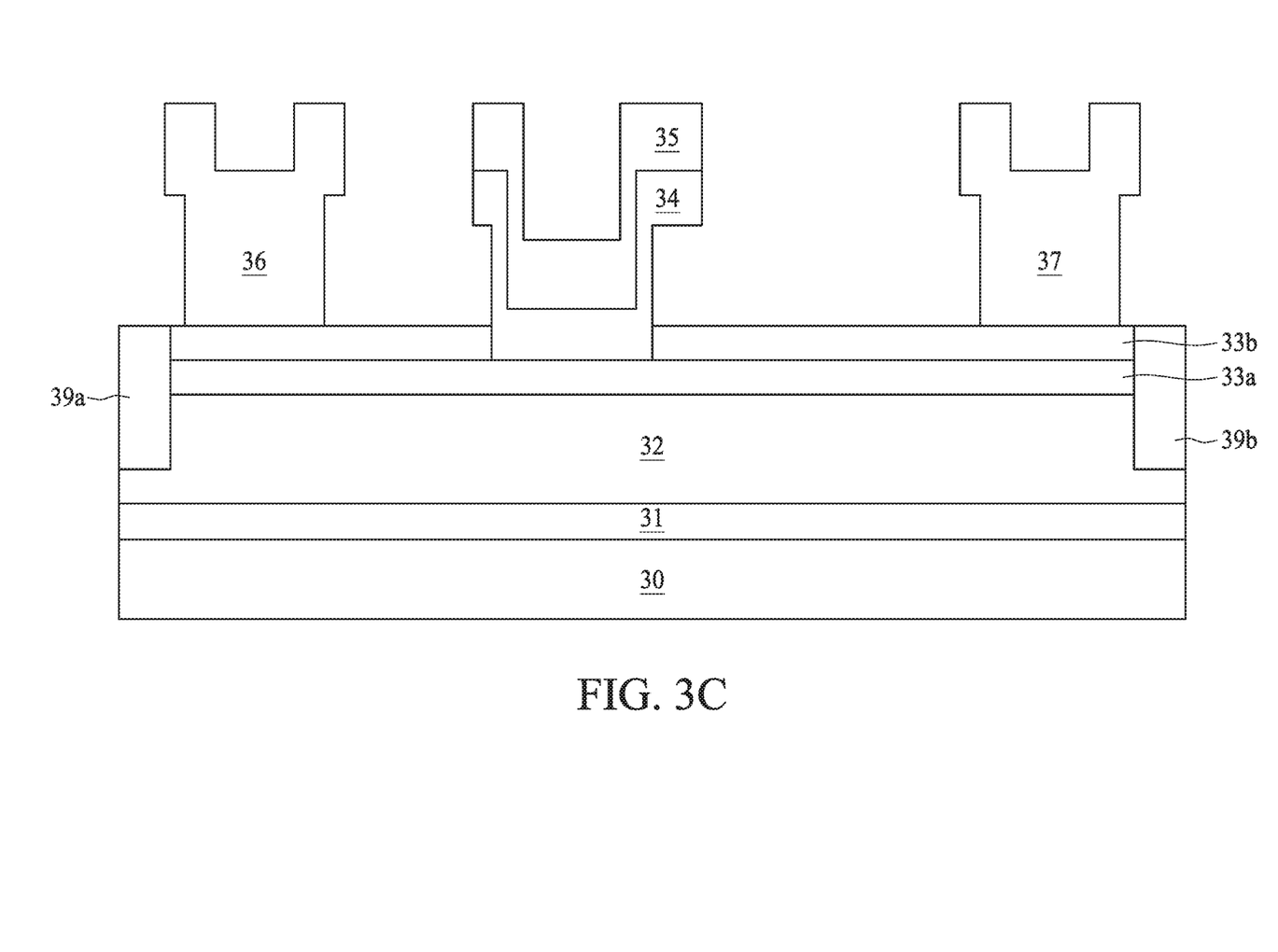

Referring to FIG. 3C, an opening is formed from the top surface of the third III-V compound layer 33b to the second III-V compound layer 33a. The opening is defined by lithography and etching processes to expose the top surface of the second III-V compound layer 33a. The first dielectric layer 34 is formed within the opening and on the top surface of the second III-V compound layer 33a. In some embodiments, the first dielectric layer 34 includes silicon oxide and/or silicon nitride. In some embodiments, the first dielectric layer 34 is formed by performing a low pressure chemical vapor deposition (LPCVD) method without plasma using $SiH_4$ and $NH_3$ gases. An operation temperature is in a range of from about 650° C. to about 800° C. An operation pressure is in a range of about 0.1 Torr and about 1 Torr.

Then a metal layer is deposited in the first dielectric layer 34 to form the gate region 35. In some embodiments, the gate region 35 includes a refractory metal or its compounds, e.g., titanium (Ti), titanium nitride (TiN), titanium tungsten (TiW) and tungsten (W). Alternatively, the gate region 35 includes nickel (Ni), gold (Au) or copper (Cu).

Figure 3D:
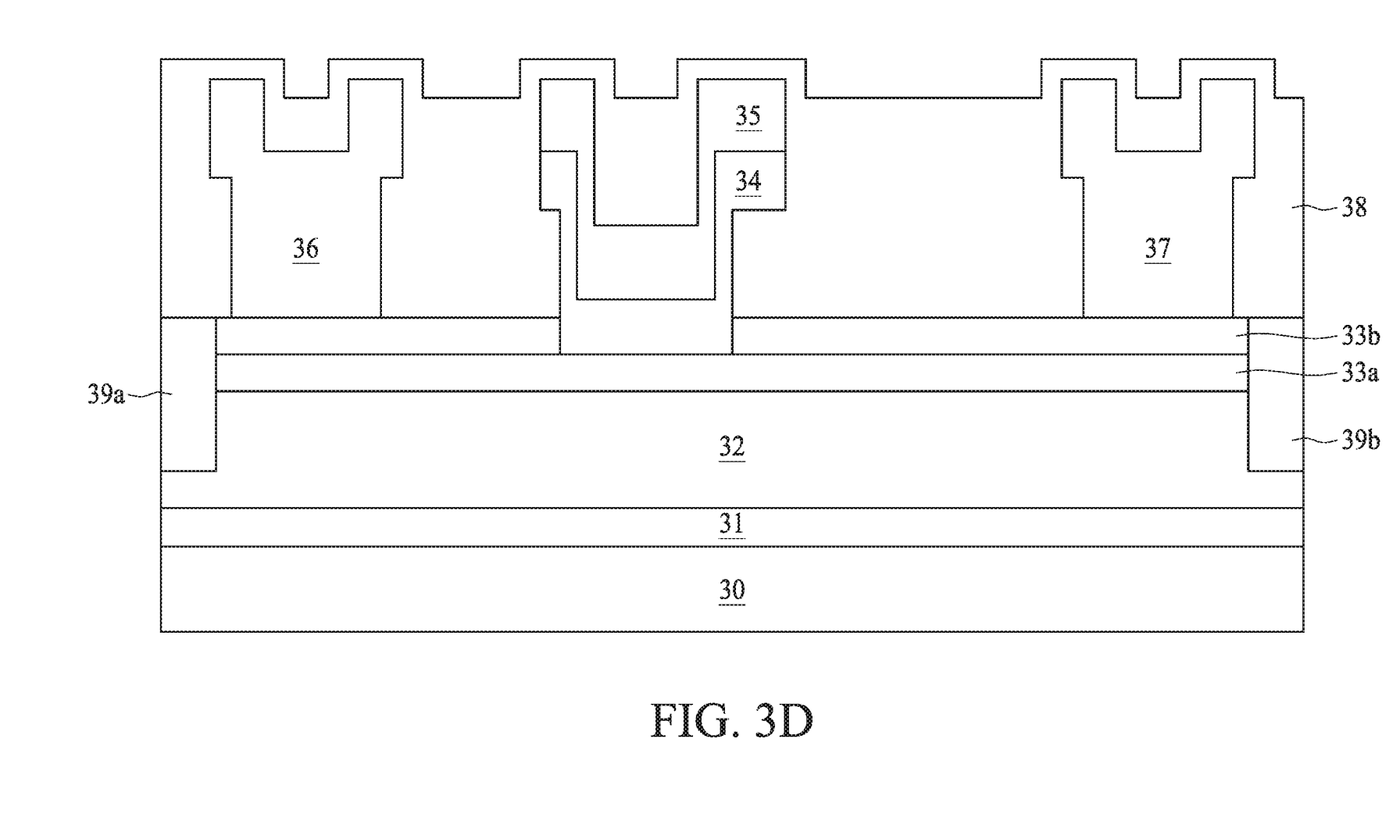

Referring to FIG. 3D, a second dielectric layer 38 is deposited on the source region 36, the drain region 37, the gate region 35 and the third III-V compound layer 33b. In some examples, the second dielectric layer 38 comprises silicon oxide, silicon nitride, gallium oxide, aluminum oxide, scandium oxide, zirconium oxide, lanthanum oxide or hafnium oxide. In some embodiments, the second dielectric layer 38 is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the second dielectric layer 38 is deposited. The ALD method provides a uniform thickness of the second dielectric layer 38 with high quality. In some embodiments, the second dielectric layer 38 is formed by a plasma enhanced chemical vapor deposition (PECVD) or a low pressure chemical vapor deposition (LPCVD).

As stated above, the existing III-V compound semiconductor structure cannot achieve low on-resistance and high reliability simultaneously by using a single AlGaN layer. In accordance with some embodiments of the present disclosure, by epitaxially growing multiple AlGaN layers with different percentage of Al on the GaN layer, the semiconductor structure manufactured by the operations shown in FIG. 3A to FIG. 3D would have low on-resistance and high efficiency without reducing the reliability.

One embodiment of the present disclosure provides a semiconductor device. The semiconductor device comprises a substrate, a first III-V compound layer over the substrate, a second III-V compound layer on the first III-V compound layer, a third III-V compound layer on the second III-V compound layer, a source region on the third III-V compound layer, and a drain region on the third III-V compound layer. A percentage of aluminum of the third III-V compound layer is greater than that of the second III-V compound layer.

One embodiment of the present disclosure provides a high electron mobility transistor (HEMT). The HEMT comprises a substrate, a first III-V compound layer over the substrate, a second III-V compound layer on the first III-V compound layer, a third III-V compound layer on the second III-V compound layer, a source region on the third III-V compound layer, a drain region on the third III-V compound layer, a first dielectric layer penetrating the third III-V compound layer and on the second III-V compound layer, and a gate region on the first dielectric layer. A ratio of the distance between the first dielectric layer and the third III-V compound layer beneath the drain region to a distance between the first dielectric layer and the drain region is in a range from 0 to about 0.8.

One embodiment of the present disclosure provides a method of manufacturing a semiconductor device. The method comprises providing a substrate, forming a first III-V compound layer over the substrate, forming a second III-V compound layer with a first concentration of Al on the first III-V compound layer, forming a third III-V compound layer with a second concentration of Al on the second III-V compound layer, forming a source region on the third III-V compound layer, and forming a drain region on the third III-V compound layer. The second concentration of Al is higher than the first concentration of Al.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A high electron mobility transistor (HEMT), comprising:
   a substrate;
   a first III-V compound layer over the substrate;
   a second III-V compound layer on the first III-V compound layer;
   a third III-V compound layer on the second III-V compound layer;
   a source region on the third III-V compound layer;
   a drain region on the third III-V compound layer;
   a first dielectric layer arranged on the second III-V compound layer through the third III-V compound layer; and
   a gate region on the first dielectric layer,
   wherein a bottom of the gate region is higher than a top surface of the third III-V compound layer, and a bottom of the first dielectric layer is flush with a bottom of the third III-V compound layer, so that a thickness of the first dielectric layer is greater than a maximum thickness of the third III-V compound layer.

2. The HEMT of claim 1, wherein a percentage of aluminum (Al) of the third III-V compound layer is greater than that of the second III-V compound layer.

3. The HEMT of claim 1, wherein a ratio of a percentage of Al of the third III-V compound layer to that of the second III-V compound layer is in a range from about 1.1 to about 2.5.

4. The HEMT of claim 1, wherein a percentage of Al of the second III-V compound layer is in a range from about 12% to about 18%.

5. The HEMT of claim 1, wherein a percentage of Al of the third III-V compound layer is in a range from about 23% to about 40%.

6. The HEMT of claim 1, wherein
   a side wall of the third III-V compound layer is separated from a side wall of the first dielectric layer by a first lateral distance;
   a side wall of the entirety of the drain region facing the gate region is separated from the side wall of the first dielectric layer by a second lateral distance;
   the side wall of the third III-V compound layer, the side wall of the drain region and the side wall of the first dielectric layer are on a same side of the gate region; and
   the second lateral distance is larger than the first lateral distance.

7. The HEMT of claim 1, wherein the first III-V compound layer comprises GaN, GaAs or InP.

8. The HEMT of claim 1, wherein the second III-V compound layer and the third III-V compound layer comprise AlGaN, AlGaAs or AlInP.

9. A high electron mobility transistor (HEMT), comprising:
   a substrate;
   a first III-V compound layer over the substrate;
   a second III-V compound layer on the first III-V compound layer;
   a third III-V compound layer on the second III-V compound layer;
   a source region on the third III-V compound layer;
   a drain region on the third III-V compound layer;
   a first dielectric layer arranged on the second III-V compound layer through the third III-V compound layer;
   a gate region on the first dielectric layer,
   wherein the third III-V compound layer is in direct contact with the second III-V compound layer, a bottom of the gate region is higher than a top surface of the third III-V compound layer, and a bottom of the first dielectric layer is flush with a bottom of the third III-V compound layer, so that a thickness of the first dielectric layer is greater than a maximum thickness of the third III-V compound layer, and a percentage of aluminum (Al) of the third III-V compound layer is greater than that of the second III-V compound layer;
   the third III-V compound layer comprises laterally separated first portion and second portion arranged on a first side and a second side of the gate region, respectively,
   the source region and the drain region reside on the first side and the second side of the gate region, respectively.

10. The HEMT of claim 9, wherein
    a side wall of the first portion of the third III-V compound layer and a first side wall of the first dielectric layer are laterally separated from each other by a first distance,
    a side wall of the second portion of the third III-V compound layer and a second side wall of first dielectric layer are laterally separated from each other by a second distance,
    the first side wall and the second side wall of the first dielectric layer are arranged on the first side and the second side of the gate region, respectively, the first distance is smaller than the second distance,
a side wall of a first region of the drain region and the source region is laterally separated from one of the first side wall and the second side wall of the first dielectric layer by a third distance;
the side wall of the first region and the one of the first side wall and the second side wall of the first dielectric layer are on a same side of the gate region; and
the third distance is larger than one of the first distance and the second distance corresponding to the one of the first side wall and the second side wall of the first dielectric layer.

11. The HEMT of claim 10, wherein
the third distance is furthest between the drain region and the first dielectric layer; and
a ratio of the second distance to the third distance is about 0.8.

12. The HEMT of claim 9, wherein a ratio of a percentage of Al of the third III-V compound layer to that of the second III-V compound layer is in a range from about 1.1 to about 2.5.

13. The HEMT of claim 9, wherein a percentage of Al of the second III-V compound layer is in a range from about 12% to about 18%.

14. The HEMT of claim 9, wherein a percentage of Al of the third III-V compound layer is in a range from about 23% to about 40%.

15. The HEMT of claim 9, wherein the first III-V compound layer comprises GaN, GaAs or InP.

16. The HEMT of claim 9, wherein the second III-V compound layer and the third III-V compound layer comprise AlGaN, AlGaAs or AlInP.

17. A high electron mobility transistor (HEMT), comprising:
a substrate;
a first III-V compound layer over the substrate;
a second III-V compound layer on the first III-V compound layer;
a third III-V compound layer on the second III-V compound layer;
a source region on the third III-V compound layer;
a drain region on the third III-V compound layer;
a first dielectric layer arranged on the second III-V compound layer through the third III-V compound layer; and
a gate region on the first dielectric layer,
wherein a bottom of the gate region is higher than a top surface of the third III-V compound layer, and a bottom of the first dielectric layer is flush with a bottom of the third III-V compound layer, so that a thickness of the first dielectric layer is greater than a maximum thickness of the third III-V compound layer, the third III-V compound layer is in direct contact with the second III-V compound layer, and a percentage of aluminum (Al) of the third III-V compound layer is greater than that of the second III-V compound layer; and
a bottom-most portion of the first dielectric layer is interfacing with the second III-V compound layer and coplanar with the bottom of the third III-V compound layer.

18. The HEMT of claim 17, wherein the percentage of Al of the third III-V compound layer is in a range from about 23% to about 40%.

19. The HEMT of claim 17, wherein a ratio of the percentage of Al of the third III-V compound layer to that of the second III-V compound layer is in a range from about 1.1 to about 2.5.

20. The HEMT of claim 17, wherein the percentage of Al of the second III-V compound layer is in a range from about 12% to about 18%.

* * * * *